(12) United States Patent
Wright

(10) Patent No.: US 8,900,364 B2
(45) Date of Patent: Dec. 2, 2014

(54) HIGH PRODUCTIVITY VAPOR PROCESSING SYSTEM

(75) Inventor: Jason Wright, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 475 days.

(21) Appl. No.: 13/306,508

(22) Filed: Nov. 29, 2011

(65) Prior Publication Data

US 2013/0133580 A1    May 30, 2013

(51) Int. Cl.
| | |
|---|---|
| *C23C 16/455* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl.
USPC .................. 118/715; 156/345.33; 156/345.34

(58) Field of Classification Search
CPC . H01J 37/3244; H01J 37/321; H01J 37/3211; H01J 37/32449; H01J 37/32724; H01J 37/32541; H01J 21/67069; C23C 16/45565; C23C 16/455; C23C 16/45502; C23C 16/4412; C23C 16/45561; C23C 16/45582; C23C 16/3244; C23C 16/321; H01L 21/67069; C30B 25/14
USPC .......................... 118/715; 156/345.33, 345.34
See application file for complete search history.

(56) References Cited

U.S. PATENT DOCUMENTS

| | | | | |
|---|---|---|---|---|
| 4,793,975 | A * | 12/1988 | Drage | 422/186.05 |
| 5,088,444 | A | 2/1992 | Ohmine et al. | |
| 5,352,294 | A * | 10/1994 | White et al. | 118/725 |
| 5,582,866 | A * | 12/1996 | White | 427/248.1 |
| 5,611,865 | A * | 3/1997 | White et al. | 118/725 |
| 5,884,009 | A * | 3/1999 | Okase | 392/418 |
| 6,025,013 | A * | 2/2000 | Heming et al. | 427/9 |
| 6,156,151 | A * | 12/2000 | Komino et al. | 156/345.29 |
| 6,178,660 | B1 * | 1/2001 | Emmi et al. | 34/412 |
| 6,206,972 | B1 * | 3/2001 | Dunham | 118/715 |
| 6,787,463 | B2 | 9/2004 | Mardian et al. | |
| 6,821,910 | B2 * | 11/2004 | Adomaitis et al. | 438/758 |
| 6,869,641 | B2 * | 3/2005 | Schmitt | 427/248.1 |
| 6,955,741 | B2 * | 10/2005 | Yamagishi | 156/345.51 |
| 7,153,542 | B2 * | 12/2006 | Nguyen et al. | 427/248.1 |
| 7,160,392 | B2 * | 1/2007 | Shang et al. | 118/728 |
| 7,273,526 | B2 * | 9/2007 | Shinriki et al. | 118/715 |
| 7,276,123 | B2 * | 10/2007 | Shimizu et al. | 118/719 |
| 7,718,030 | B2 * | 5/2010 | Funk et al. | 156/345.29 |
| 7,824,935 | B2 | 11/2010 | Verma et al. | |
| 7,850,779 | B2 * | 12/2010 | Ma et al. | 118/715 |

(Continued)

FOREIGN PATENT DOCUMENTS

JP    2002110567 A *  4/2002   ........... H01L 21/205

*Primary Examiner* — Rudy Zervigon

(57) ABSTRACT

A processing chamber is provided. The processing chamber includes a lid having a plurality of valves affixed thereto, the plurality of valves operable to enable process gases to flow into the chamber. The chamber includes a bottom portion, where the bottom portion includes a base and side walls extending from the base. A surface of the base is configured to support a substrate. A showerhead is affixed to a bottom surface of the lid. A bottom surface of the showerhead is configured to include a central port for providing process gases into the chamber. The central port is surrounded by an annular pump channel. The annular pump channel is surrounded by an annular purge channel, where a first ridge separates the delivery region and the annular pump channel and a second ridge separates the annular pump channel and the annular purge channel.

19 Claims, 5 Drawing Sheets

(56) References Cited

U.S. PATENT DOCUMENTS

| | | | |
|---|---|---|---|
| 7,947,531 B1 | 5/2011 | Chiang | |
| 7,967,912 B2* | 6/2011 | Yajima et al. | 118/730 |
| 7,980,003 B2* | 7/2011 | Aoki et al. | 34/549 |
| 8,092,598 B2* | 1/2012 | Baek et al. | 118/715 |
| 8,092,606 B2* | 1/2012 | Park et al. | 118/728 |
| 8,236,106 B2* | 8/2012 | Iizuka et al. | 118/715 |
| 8,277,888 B2* | 10/2012 | Dedontney | 427/248.1 |
| 8,293,013 B2* | 10/2012 | DeDontney | 118/715 |
| 8,298,370 B2* | 10/2012 | Byun | 156/345.34 |
| 8,366,828 B2* | 2/2013 | Iizuka | 118/715 |
| 8,402,845 B2* | 3/2013 | Dedontney | 73/865.9 |
| 8,402,918 B2* | 3/2013 | Kadkhodayan et al. | 118/723 E |
| 8,506,713 B2* | 8/2013 | Takagi | 118/715 |
| 8,609,519 B2* | 12/2013 | Lee et al. | 438/485 |
| 8,709,162 B2* | 4/2014 | Leung et al. | 118/728 |
| 8,733,280 B2* | 5/2014 | Yap et al. | 118/723 E |
| 2003/0124842 A1* | 7/2003 | Hytros et al. | 438/680 |
| 2004/0052972 A1* | 3/2004 | Schmitt | 427/569 |
| 2004/0099213 A1* | 5/2004 | Adomaitis et al. | 118/715 |
| 2004/0221808 A1* | 11/2004 | Kawano | 118/715 |
| 2005/0022737 A1* | 2/2005 | Shimizu et al. | 118/715 |
| 2005/0160984 A1* | 7/2005 | Schmitt | 118/715 |
| 2006/0011298 A1* | 1/2006 | Lim et al. | 156/345.34 |
| 2006/0234514 A1* | 10/2006 | Gianoulakis et al. | 438/758 |
| 2006/0249077 A1* | 11/2006 | Kim et al. | 118/723 MP |
| 2006/0263522 A1* | 11/2006 | Byun | 427/248.1 |
| 2006/0286801 A1* | 12/2006 | Kim | 438/680 |
| 2007/0026540 A1* | 2/2007 | Nooten et al. | 438/5 |
| 2007/0169373 A1* | 7/2007 | Aoki et al. | 34/549 |
| 2008/0202416 A1* | 8/2008 | Provencher et al. | 118/715 |
| 2008/0236495 A1* | 10/2008 | Tompa | 118/724 |
| 2009/0061108 A1 | 3/2009 | Endo et al. | |
| 2009/0061646 A1* | 3/2009 | Chiang et al. | 438/763 |
| 2009/0142933 A1* | 6/2009 | Yajima et al. | 438/758 |
| 2009/0156015 A1* | 6/2009 | Park et al. | 438/758 |
| 2009/0159213 A1* | 6/2009 | Bera et al. | 156/345.34 |
| 2009/0178616 A1* | 7/2009 | Byun | 118/715 |
| 2009/0229754 A1* | 9/2009 | Iizuka et al. | 156/345.34 |
| 2009/0236041 A1* | 9/2009 | Iizuka | 156/345.34 |
| 2009/0275210 A1 | 11/2009 | Shanker et al. | |
| 2010/0167551 A1* | 7/2010 | DeDontney | 438/758 |
| 2010/0193471 A1* | 8/2010 | Funk et al. | 216/67 |
| 2010/0272895 A1* | 10/2010 | Tsuda | 427/255.32 |
| 2010/0279008 A1* | 11/2010 | Takagi | 427/248.1 |
| 2011/0067815 A1* | 3/2011 | Iizuka et al. | 156/345.26 |
| 2011/0132542 A1* | 6/2011 | Iizuka | 156/345.33 |
| 2011/0162580 A1* | 7/2011 | Provencher et al. | 118/715 |
| 2011/0214814 A1* | 9/2011 | Iizuka et al. | 156/345.34 |
| 2012/0009765 A1* | 1/2012 | Olgado | 438/478 |
| 2012/0073501 A1* | 3/2012 | Lubomirsky et al. | 118/723 E |
| 2012/0145078 A1* | 6/2012 | Huang et al. | 118/715 |
| 2012/0305190 A1* | 12/2012 | Kang et al. | 156/345.34 |
| 2012/0321786 A1* | 12/2012 | Satitpunwaycha et al. | 427/252 |
| 2013/0125818 A1* | 5/2013 | Wright et al. | 118/723 R |
| 2013/0130490 A1* | 5/2013 | Lee et al. | 438/597 |
| 2013/0133580 A1* | 5/2013 | Wright | 118/725 |
| 2014/0065788 A1* | 3/2014 | Lee et al. | 438/382 |
| 2014/0065827 A1* | 3/2014 | Kang et al. | 438/694 |

* cited by examiner

HIGH PRODUCTIVITY VAPOR PROCESSING SYSTEM

BACKGROUND

Combinatorial processing enables rapid evaluation of semiconductor processes. The systems supporting the combinatorial processing are flexible to accommodate the demands for running the different processes either in parallel, serial or some combination of the two.

Gas vapor delivery is commonly used within the semiconductor industry, as well as within solar, glass coating, and other industries, in order to deposit a layer over a substrate. Physical vapor deposition and chemical vapor deposition are common gas vapor delivery techniques.

As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

The equipment supporting the combinatorial processing is continually undergoing improvements in order to enable further flexibility and gain efficiency in the manufacturing R&D processes. It is within this context that the embodiments arise.

SUMMARY

Embodiments of the present invention provide an apparatus that enables efficient processing of substrates to assist in the research and development of semiconductor processing. Several inventive embodiments of the present invention are described below.

In some embodiments of the invention a processing chamber is provided. The processing chamber includes a lid having a plurality of valves affixed thereto, the plurality of valves are operable to enable process gases to flow into the chamber. The chamber includes a bottom portion, where the bottom portion includes a base and side walls extending from the base. A surface of the base is configured to support a substrate. A showerhead is affixed to a bottom surface of the lid. A bottom surface of the showerhead is configured to include a central port for providing process gases into the chamber. The central port is surrounded by an annular pump channel. The annular pump channel is surrounded by a purge channel, where a first ridge separates the delivery region and the annular pump channel and a second ridge separates the annular pump channel and the purge channel.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
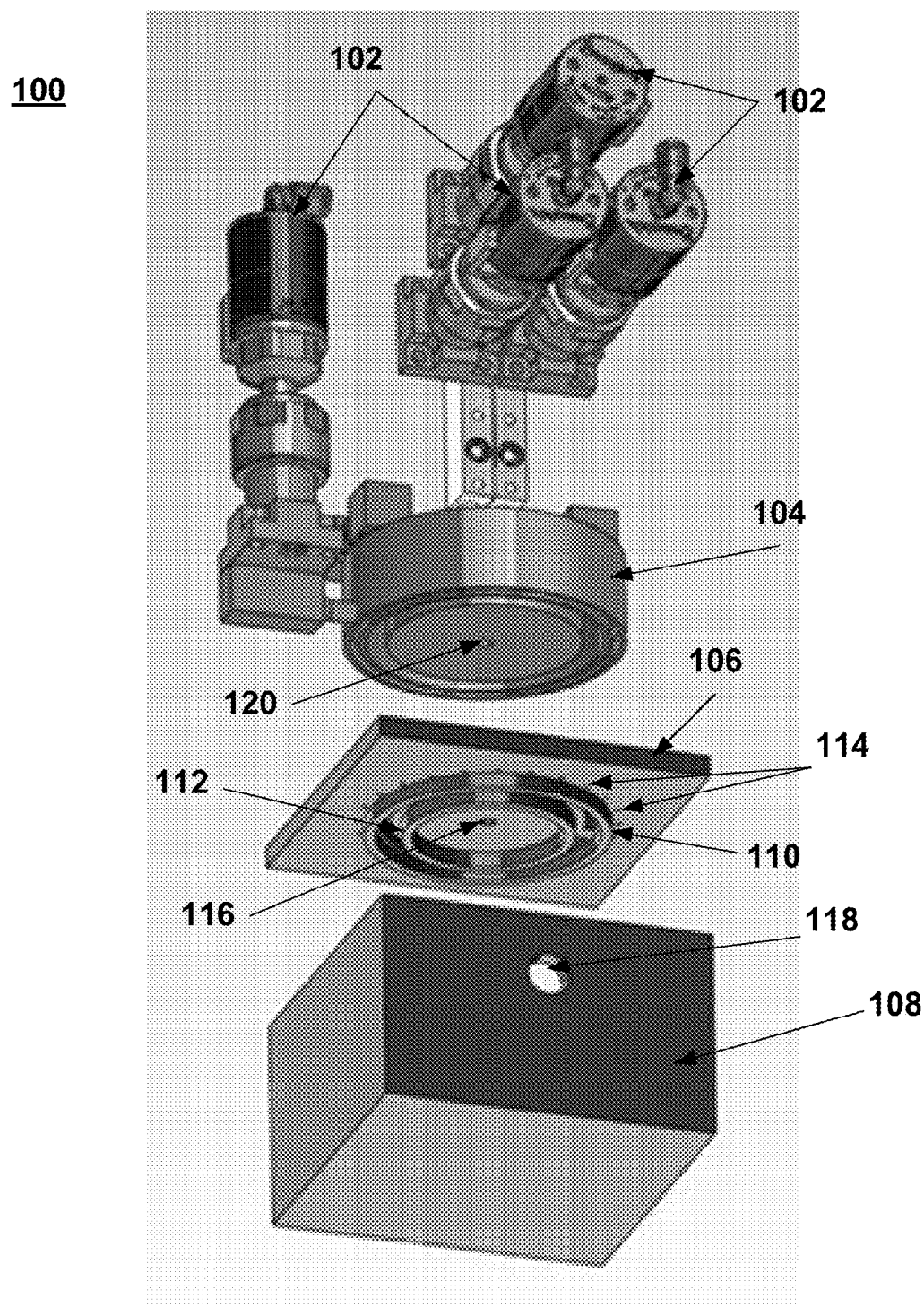
FIG. 1 is a simplified schematic diagram illustrating components of a processing chamber in accordance with some embodiments of the invention.

The embodiments described herein provide a method and apparatus for a semiconductor processing system. It will be obvious, however, to one skilled in the art, that the present invention may be practiced without some or all of these specific details. In other instances, well known process operations have not been described in detail in order not to unnecessarily obscure the present invention.

The embodiments describe a minimum volume vapor processing chamber for high productivity processing. The chamber has a design where process fluids are delivered through a compact lid design and where the pumping and the purging are provided through a showerhead disposed under the lid. The lid and showerhead are disposed over side walls extending from a base of the chamber to define a processing region. The substrate sits on a substantially flat surface of the base that extends between each of the side walls during processing within the chamber. In order for the design to maintain a relatively small footprint and volume, no rotation of the lid or the substrate is provided. The showerhead is designed with a delivery port for providing process fluids that is defined within a central portion of the showerhead and an annular pump channel is defined around the central portion and the delivery port. A purge channel is defined around the annular pump channel. In some embodiments, a first annular ridge separates the delivery region and the annular pump channel. A second annular ridge separates the pump channel and the purge channel. The first and second annular ridges may extend by different lengths from the bottom surface of the showerhead to manipulate the fluid flow over the substrate. The delivery region may be coupled to a purge fluid, as well as process fluids, where separate valves are provided for control of the purge and process fluids. In some embodiments, a portion of each of the delivery lines shares a purge valve. A heater may be integrated below a top surface of the base to provide heat to the top surface of the base to heat the substrate. The small volume of the chamber enables more efficient processing to support combinatorial processing and to accelerate the research process.

The embodiments may be utilized to process a coupon from a combinatorial processing chamber in some embodiments. Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference. HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 is a simplified schematic diagram illustrating components of a processing chamber in accordance with some embodiments of the invention. Processing chamber 100 includes a bottom portion 108, showerhead 106, and lid 104. Lid 104 has a plurality of valves 102 coupled to a surface of the lid. It should be appreciated that all of the processing gases or fluids and other utilities required by processing chamber 100, including vacuum, are supplied through lid 104 in some embodiments. Process fluids enter a processing region of chamber 100 within bottom portion 108 through a central port 116 of showerhead 106. Central port 116 mates with a central port 120 of lid 104. Showerhead 106 is disposed under a bottom surface of lid 104. The bottom surface of showerhead 106 includes central port 116 surrounded by ridge 112, which in turn is surrounded by ridge 110. It should be appreciated that ridge 110 and ridge 112 are annular ridges that may have different extension heights from the bottom surface of showerhead 106 in some embodiments. In some embodiments, the extension of ridge 110 from the bottom surface of showerhead 106 is greater than the extension of ridge 112 from the bottom surface of the showerhead. The annular region between ridge 112 and ridge 110 may be referred to as an annular pump channel which is coupled to a vacuum source through showerhead 106 and lid 104. Along an outer periphery of ridge 110 are plurality of holes 114. Holes 114 provide access for a purge fluid into bottom portion 108. The spaced apart plurality of holes 114 may be referred to as a purge channel, and the purge channel; may be configured as other alternatives than inlet holes, such as a channel, segmented portions of a channel, etc. Bottom portion 108 includes aperture 118. Aperture 118 can be utilized to monitor a pressure within the processing region defined within bottom portion 108 and below showerhead 106 in some embodiments.

Figure 2:
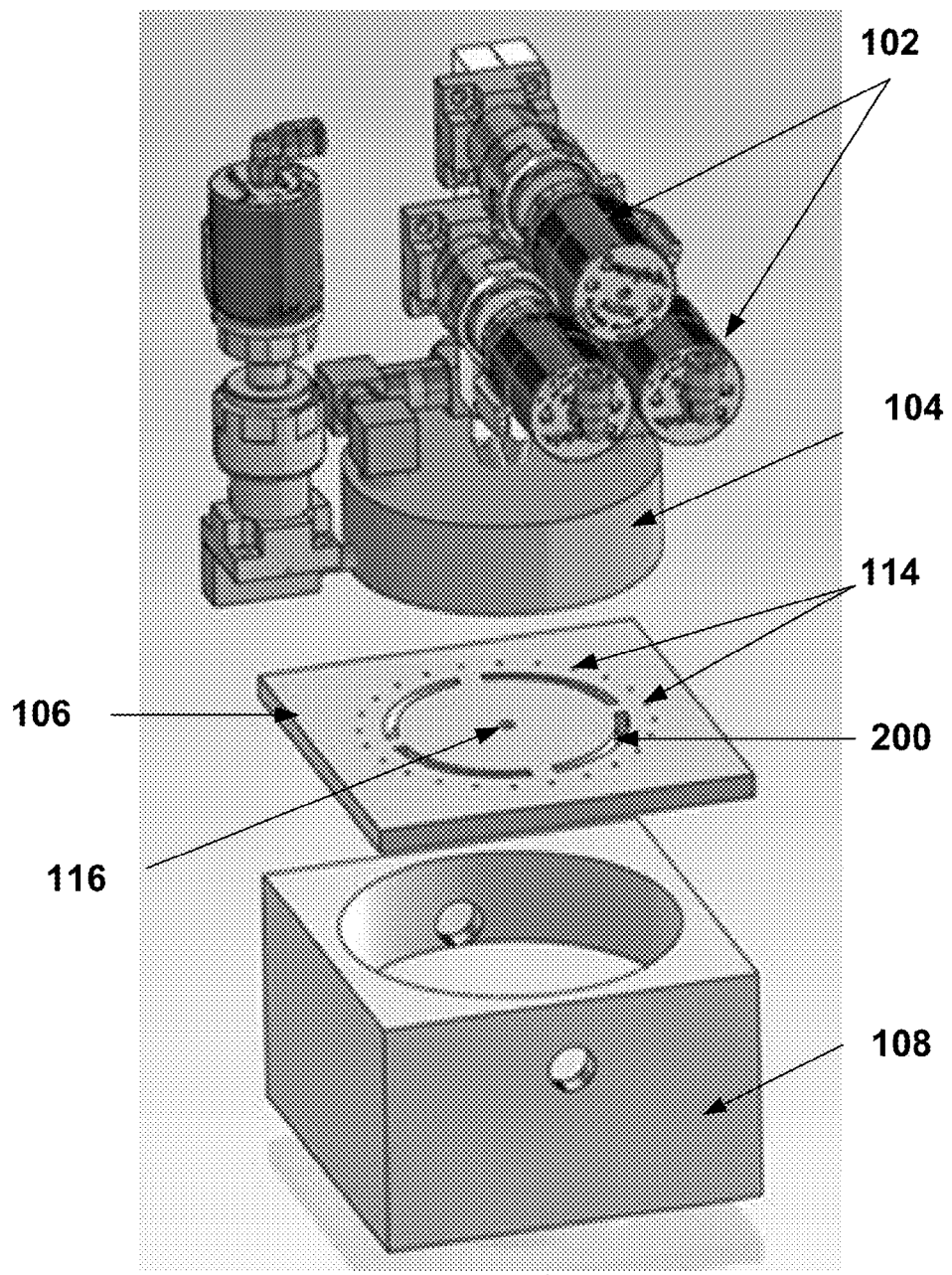
FIG. 2 is a simplified schematic diagram illustrating an alternative perspective view of the processing chamber in accordance with some embodiments of the invention.

FIG. 2 is a simplified schematic diagram illustrating an alternative perspective view of the processing chamber in accordance with some embodiments of the invention. Lid 104 is disposed over showerhead 106 which is placed onto a top surface of the sidewalls of bottom portion 108. In this view, a top surface of showerhead 106 is provided. The top surface of showerhead 106 includes a plurality of holes 114 disposed around a periphery of segmented inlets 200. Segmented inlets 200 surround central port 116. As described above, segmented inlets 200 provide the pumping capability to an annular pump channel defined on opposing surface of showerhead 106. The plurality of holes 114 provides purging capability and can be located at the outer periphery of ridge 110 of FIG. 1. It should be appreciated that while the pumping capability is provided through the annular segmented channel 200, other alternatives with continuous channels, spaced apart holes, etc., are possible. It should be further appreciated that the bottom surface of bottom portion 108 is a substantially flat surface as illustrated in FIG. 2. In some embodiments, a base of the bottom portion is a heater. Thus, a coupon is inserted into the chamber through the top opening of bottom portion 108 and rests directly on the surface of the base, which may be a heater. Thereafter, showerhead 106 and with lid 104 are placed onto the top surface of sidewalls of the bottom portion 108.

Figure 3:
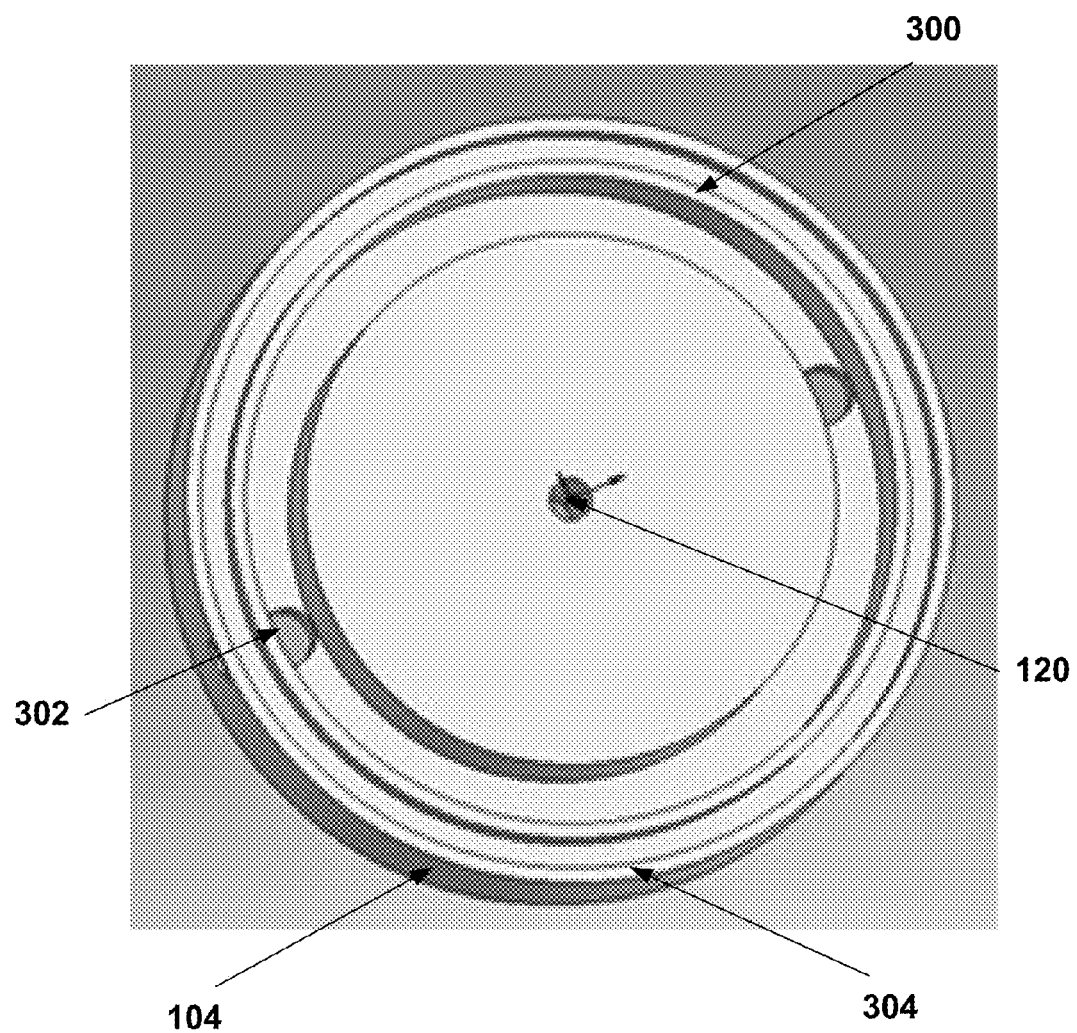
FIG. 3 is a simplified schematic diagram illustrating a bottom surface of the lid of the processing chamber in accordance with some embodiments of the invention.

FIG. 3 is a simplified schematic diagram illustrating a bottom surface of the lid of the processing chamber in accordance with some embodiments of the invention. Lid 104 includes a central port 120 extending therethrough. As mentioned above, central port 120 provides fluids to a corresponding central port of a showerhead located below lid 104. Ports 302 along an annular channel defined between central port 120 and ridge 300 provide access for pumping access, i.e., vacuum, in some embodiments. It should be appreciated that the annular channel defined between central port 120 and ridge 300 mates with the segmented inlets 200 defined on a top surface of the showerhead of FIG. 2. In some embodiments, the vacuum source for ports 302 is provided through a side surface of lid 104. An outer annular channel defined between outer peripheral ridge 304 and ridge 300 mates with the plurality of holes 114 of the showerhead of FIG. 2 in some embodiments.

Figure 4:
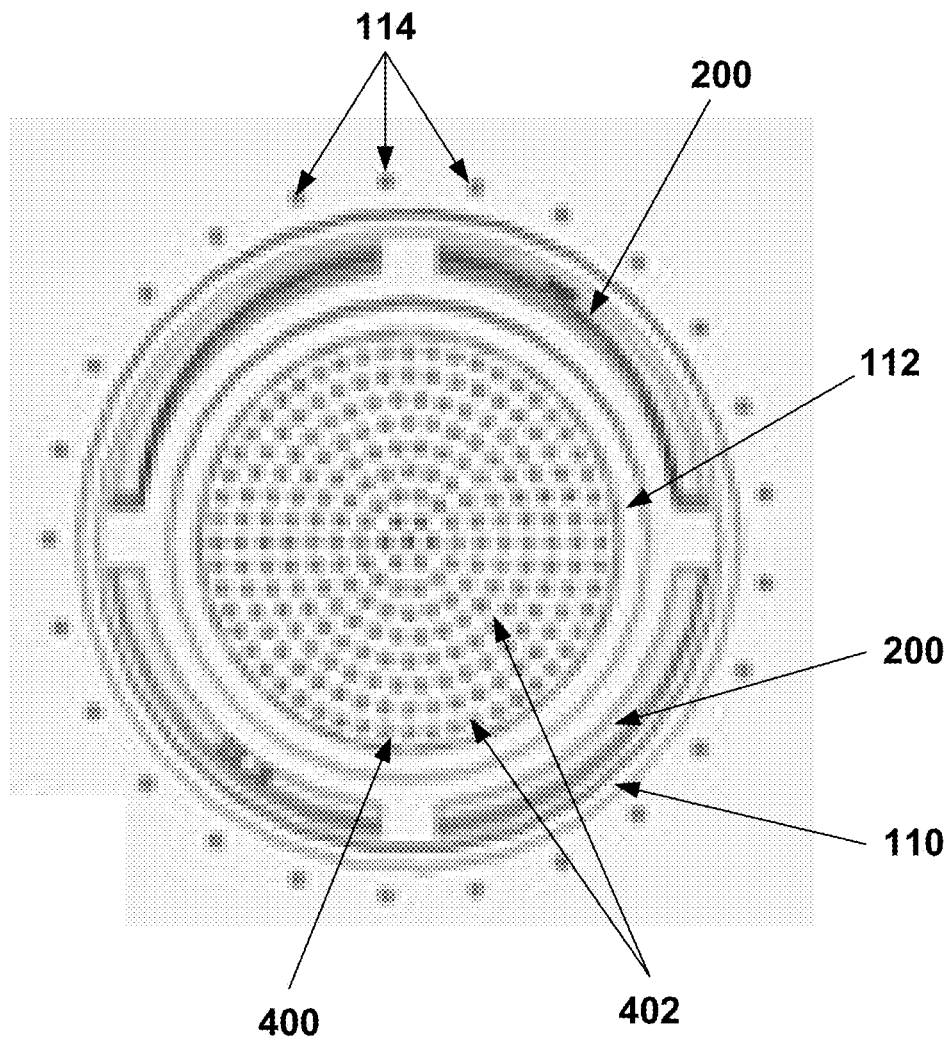
FIG. 4 is a simplified schematic diagram illustrating a view of the bottom surface of the showerhead in accordance with some embodiments of the invention.

FIG. 4 is a simplified schematic diagram illustrating a view of the bottom surface of the showerhead in accordance with some embodiments of the invention. Diffuser plate 400 has a plurality of openings 402 and is disposed over a central region of showerhead 106. Diffuser plate 400 is disposed within a region surrounded by ridge 112. Segmented inlets 200 are illustrated within an annular pump channel defined between ridge 112 and ridge 110. The plurality of holes 114 are defined outside of ridge 110 and configured as a purge channel which has an annular shape in accordance with some embodiments of the invention.

Figure 5:
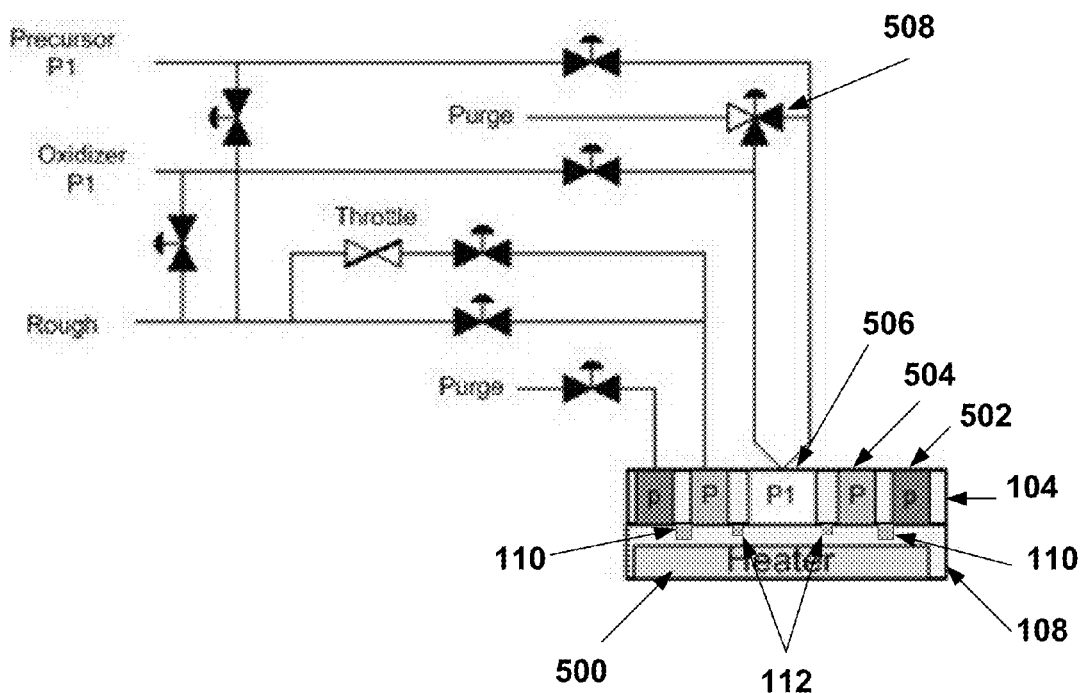
FIG. 5 is a simplified cross-sectional view of the processing chamber with associated facility supplies accessing the processing region through the lid in accordance with some embodiments of the invention.

FIG. 5 is a simplified cross-sectional view of the processing chamber with associated facility supplies accessing the processing region through the lid in accordance with some embodiments of the invention. Lid 104 includes purge region 502, pump region 504 and precursor/oxidizer delivery region 506. As illustrated in FIG. 5, the lines supplying precursor/oxidizer delivery region 506 share purge valve 508. Thus, during the purge operations after addition of the precursor or oxidizer, the delivery lines for the precursor and the oxidizer are both purged, even though only one of the precursor or oxidizer may have been used. Ridges 110 and 112 are illustrated below a surface of lid 104. In some embodiments ridge 110 extends farther from a surface of the showerhead (not shown for illustrative purposes) disposed under lid 104 than the extension of ridge 112 from the surface of the showerhead. In such embodiments, the processing region is defined between ridges 110. That is, a coupon placed on heater 500, which may be the base of bottom portion 108, is positioned within the region defined between inner surfaces of ridge 110. In some embodiments the base of bottom portion 108 may have a liner disposed thereon and the substrate or coupon rests on the liner. The liner may be disposed after the processing.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A processing chamber comprising:
   a lid having a plurality of valves affixed thereto,
      the plurality of valves operable to supply process gases into the processing chamber;
   a bottom portion,
      the bottom portion including a base and side walls extending from the base toward the lid,
      wherein a surface of the base is configured to support a substrate; and
   a showerhead affixed to a bottom surface of the lid,
      a bottom surface of the showerhead comprises
         a central port,
         a first ridge surrounding the central port and defining a delivery region accessible to the central port,
         an annular pump channel surrounding the first ridge,
         a second ridge surrounding the annular pump channel, and
         a plurality of holes disposed along an outer periphery of the second ridge,
      the central port configured for providing process gases into the processing chamber,
         wherein the first ridge separates the delivery region and the annular pump channel and extends in a direction substantially normal to the surface of the base, and
         wherein the second ridge separates the annular pump channel and the plurality of holes and extends in the direction substantially normal to the surface of the base.

2. The processing chamber of claim 1, wherein the first ridge extends from a surface of the showerhead by a first length and wherein the second ridge extends from the surface of the showerhead by a second length, wherein the second length is greater than the first length.

3. The processing chamber of claim 1, wherein the base includes a heater.

4. The processing chamber of claim 1, wherein the annular pump channel comprises a plurality of segmented inlets.

5. The processing chamber of claim 1, wherein the annular pump channel is segmented in four sections.

6. The processing chamber of claim 1, wherein the bottom surface of the lid includes a delivery port configured to mate with the central port of the showerhead.

7. The processing chamber of claim 1, wherein the showerhead includes a diffuser plate.

8. The processing chamber of claim 7, wherein the diffuser plate is disposed within a region surrounded by the annular pump channel.

9. The processing chamber of claim 1, wherein all process gasses, vacuum, and utilities to operate the processing chamber are delivered through the lid.

10. A processing chamber comprising:
    a lid having a plurality of valves affixed thereto,
       the plurality of valves operable to supply process gases into the processing chamber;
    a bottom portion,
       the bottom portion including a base and side walls extending from the base toward the lid,
       wherein a surface of the base extending between each of the side walls is configured to support a substrate;
    a showerhead affixed to a bottom surface of the lid,
       a bottom surface of the showerhead comprises a central port,
          a first ridge surrounding the central port and defining a delivery region accessible to the central port,
          an annular pump channel surrounding the first ridge,
          a second ridge surrounding the annular pump channel, and
          a plurality of holes disposed along an outer periphery of the second ridge,
       the central port configured for providing process gases into the processing chamber,
          wherein the first ridge separates the delivery region and the annular pump channel and extends in a direction substantially normal to the surface of the base, and
          wherein the second ridge separates the annular pump channel and the plurality of holes and extends in the direction substantially normal to the surface of the base;
    a precursor line coupled to the central port;
    an oxidizer line coupled to the central port; and
    a purge line coupled to the precursor line and the oxidizer line.

11. The processing chamber of claim 10, wherein the first ridge extends from a surface of the showerhead by a first length and wherein the second ridge extends from the surface of the showerhead by a second length, wherein the second length is greater than the first length.

12. The processing chamber of claim 10, wherein the showerhead includes a diffuser disposed over the central port.

13. The processing chamber of claim 10, wherein the annular pump channel comprises a plurality of segmented inlets.

14. The processing chamber of claim 10, wherein the base includes a heater.

15. The processing chamber of claim 10, wherein one of the side walls includes an aperture into a processing region of the chamber.

16. The processing chamber of claim 15, wherein pressure in the processing region is monitored through the aperture.

17. The processing chamber of claim 10, wherein a top surface of the base is stationary.

18. The processing chamber of claim 10, wherein all process gasses, vacuum, and utilities to operate the processing chamber are delivered through the lid.

19. The processing chamber of claim 10, wherein the annular pump channel is segmented in four sections.

* * * * *